United States Patent
Chang (10) Patent No.: US 10,581,420 B2
(45) Date of Patent: Mar. 3, 2020

(54) SEMICONDUCTOR DEVICE

(71) Applicant: NANYA TECHNOLOGY CORPORATION, New Taipei (TW)

(72) Inventor: Chuan-Jen Chang, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/040,965

(22) Filed: Jul. 20, 2018

(65) Prior Publication Data

US 2020/0028502 A1 Jan. 23, 2020

(51) Int. Cl.
  *H03K 5/24* (2006.01)
  *G11C 11/4093* (2006.01)
  *H03F 3/16* (2006.01)

(52) U.S. Cl.
  CPC ............ *H03K 5/24* (2013.01); *G11C 11/4093* (2013.01); *H03F 3/16* (2013.01)

(58) Field of Classification Search
  USPC ......................................... 327/306
  See application file for complete search history.

(56) References Cited

U.S. PATENT DOCUMENTS

| 6,424,585 | B1 | 7/2002 | Ooishi | |
| 6,882,224 | B1 * | 4/2005 | Gaboury | H03F 1/301 330/253 |
| 7,956,641 | B1 | 6/2011 | Peng et al. | |
| 8,019,393 | B2 * | 9/2011 | Lai | G11C 7/1078 365/227 |
| 9,780,838 | B2 * | 10/2017 | Peter | H03F 3/193 |
| 2002/0158615 | A1 * | 10/2002 | Goodfellow | G01R 19/16519 323/315 |
| 2003/0227328 | A1 * | 12/2003 | Ivanov | H03F 1/308 330/264 |
| 2007/0001762 | A1 * | 1/2007 | Schrom | G01R 19/0092 330/255 |
| 2007/0109026 | A1 * | 5/2007 | Ho | H03K 5/2481 327/65 |
| 2011/0221407 | A1 | 9/2011 | Kato | |
| 2011/0304461 | A1 * | 12/2011 | Song | G06K 19/0715 340/572.1 |
| 2012/0057261 | A1 * | 3/2012 | Poulton | H04B 3/54 361/56 |
| 2012/0147979 | A1 * | 6/2012 | Best | G06F 13/4072 375/259 |

(Continued)

FOREIGN PATENT DOCUMENTS

| TW | 201333659 A1 | 8/2013 |
| TW | 201640247 A | 11/2016 |

*Primary Examiner* — Adam D Houston
(74) *Attorney, Agent, or Firm* — Muncy, Geissler, Olds & Lowe, PC (57) ABSTRACT

The present disclosure provides a semiconductor device. The semiconductor device includes a difference-expanding device and a receiver. The difference-expanding device receives an input signal having voltage levels representing logical states, and converts the input signal to a processed signal by changing, based on the voltage levels, degrees in conduction of the difference-expanding device. The receiver receives the processed signal from the difference-expanding device, and determines the logical states of the input signal based on the processed signal.

14 Claims, 10 Drawing Sheets

(56) References Cited

U.S. PATENT DOCUMENTS

| | | | |
|---|---|---|---|
| 2014/0105265 A1* | 4/2014 | Ho | H03M 1/001 |
| | | | 375/224 |
| 2015/0207411 A1* | 7/2015 | Calhoun | H02M 1/088 |
| | | | 323/235 |
| 2016/0156347 A1 | 6/2016 | Usuda | |
| 2016/0248390 A1* | 8/2016 | Issakov | H03F 3/265 |
| 2017/0012672 A1* | 1/2017 | Peter | H03F 3/193 |
| 2017/0019090 A1* | 1/2017 | Honda | H03K 19/018521 |
| 2019/0235543 A1* | 8/2019 | Chen | G05F 1/56 |

* cited by examiner

SEMICONDUCTOR DEVICE

TECHNICAL FIELD

The present disclosure relates to a semiconductor device, and more particularly, to a semiconductor device including a receiver.

DISCUSSION OF THE BACKGROUND

An input receiver in an integrated circuit (IC) functions to receive a signal external to the IC, determine logical states of the signal, and convert the signal into, for example, a rail-to-rail signal usable in the IC. Generally, in operation, the input receiver compares the signal to a reference signal, thereby determining the logical states of the signal. Next, the input receiver outputs either a voltage level representing a logically high state if the signal is higher than the reference voltage, or a voltage level representing a logically low state if the signal is lower than the reference voltage.

Typically, a greater difference of the voltage levels between a logically high state and a logically low state of the signal facilitates increased accuracy in the determination performed by the input receiver. However, in practice, the signal may be interfered with by a noise, which may cause the difference to be relatively insignificant. As a result, accuracy in the determination may be adversely affected.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device. The semiconductor device includes a difference-expanding device and a receiver. The difference-expanding device is configured to receive an input signal having voltage levels representing logical states, and to convert the input signal to a processed signal by changing, based on the voltage levels, degrees in conduction of the difference-expanding device. The receiver is configured to receive the processed signal from the difference-expanding device, and determine the logical states of the input signal based on the processed signal.

In some embodiments, the difference-expanding device is configured to operate in a first conduction state in response to a first voltage level of the voltage levels. The difference-expanding device is configured to operate in a second conduction state in response to a second voltage level of the voltage levels. The first conduction state is less conductive than the second conduction state. The difference-expanding device is further configured to increase a distinctness of the first voltage level, wherein the first voltage level represents the first logical state.

In some embodiments, when the first logical state is a logically low state, the difference-expanding device increases the distinctness of the first voltage level by decreasing the first voltage level, wherein the decreased first voltage level serves as a voltage level, which represents the logically low state, of the processed voltage.

In some embodiments, the difference-expanding device includes a resistor and a p-type transistor. The resistor is coupled between the receiver and a reference ground. The p-type transistor includes a source receiving the input signal, and a drain coupled to both the resistor and the receiver.

In some embodiments, when the first logical state is a logically high state, the difference-expanding device increases the distinctness of the first voltage level by increasing the first voltage level, wherein the increased first voltage level serves as a voltage level, which represents the logically high state, of the processed voltage.

In some embodiments, the difference-expanding device includes a resistor and an n-type transistor. The resistor is coupled between the receiver and a supply voltage. The n-type transistor includes a source receiving the input signal, and a drain coupled to both the resistor and the receiver.

In some embodiments, the drain of the n-type transistor is directly coupled to the resistor and the receiver.

Another aspect of the present disclosure provides a semiconductor device. The semiconductor device includes a difference-expanding device and a receiver. The difference-expanding device is configured to convert an input signal to a processed signal. The difference-expanding device includes a resistor and a current source. The current source is configured to provide a first current to the resistor in response to a first voltage level, which represents a logically high state of logical states of the input signal. The current source is configured to provide a second current to the resistor in response to a second voltage level, which represents a logically low state of the logical states, of the input signal. The voltage at a tap between the current source and the resistor serves as the processed signal. A voltage across the resistor based on the second current is negligible compared to that based on the first current. The receiver is configured to receive the processed signal from the difference-expanding device, and determine the logical states of the input signal based on the processed signal.

In some embodiments, the resistor and the current source are coupled between the input signal and a reference ground.

In some embodiments, a voltage at one terminal of the resistor serves as the processed signal, and a voltage at the other terminal of the resistor is the reference ground.

Another aspect of the present disclosure provides a semiconductor device. The semiconductor device includes a difference-expanding device and a receiver. The difference-expanding device is configured to receive an input signal, and convert the input signal to a processed signal by expanding a difference between a first voltage level of the input signal and a second voltage level of the input signal. The first voltage level represents a logically high state of logical states of the input signal, and the second voltage level represents a logically low state of the logical states of the input signal. The receiver is configured to receive the processed signal from the difference-expanding device, and determine the logical states of the input signal based on the processed signal.

In some embodiments, the difference-expanding device is configured to expand the difference by decreasing the first voltage level by a first degree, and decreasing the second voltage level by a second degree greater than the first degree.

In some embodiments, the difference-expanding device is configured to expand the difference by increasing the first voltage level by a first degree, and increasing the second voltage level by a second degree less than the first degree.

In some embodiments, the receiver is further configured to compare the processed signal to a reference voltage, wherein the reference voltage is dynamically adjusted between the first voltage level and the second voltage level.

In some existing DRAMs, a receiver directly receives an input signal, and compares the input signal to a reference voltage. However, the input signal may include noise, such that the receiver may not be able to correctly determine logical states of the input signal.

In the present disclosure, the difference of the voltage levels of the processed signal is relatively large compared to the difference of the voltage levels of the input signal. Even if there is noise in the processed signal, the adverse effect incurred by the noise compared to the relatively large difference of the voltage levels is insignificant and can be ignored. The receiver's accuracy in determining logical states is relatively high.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
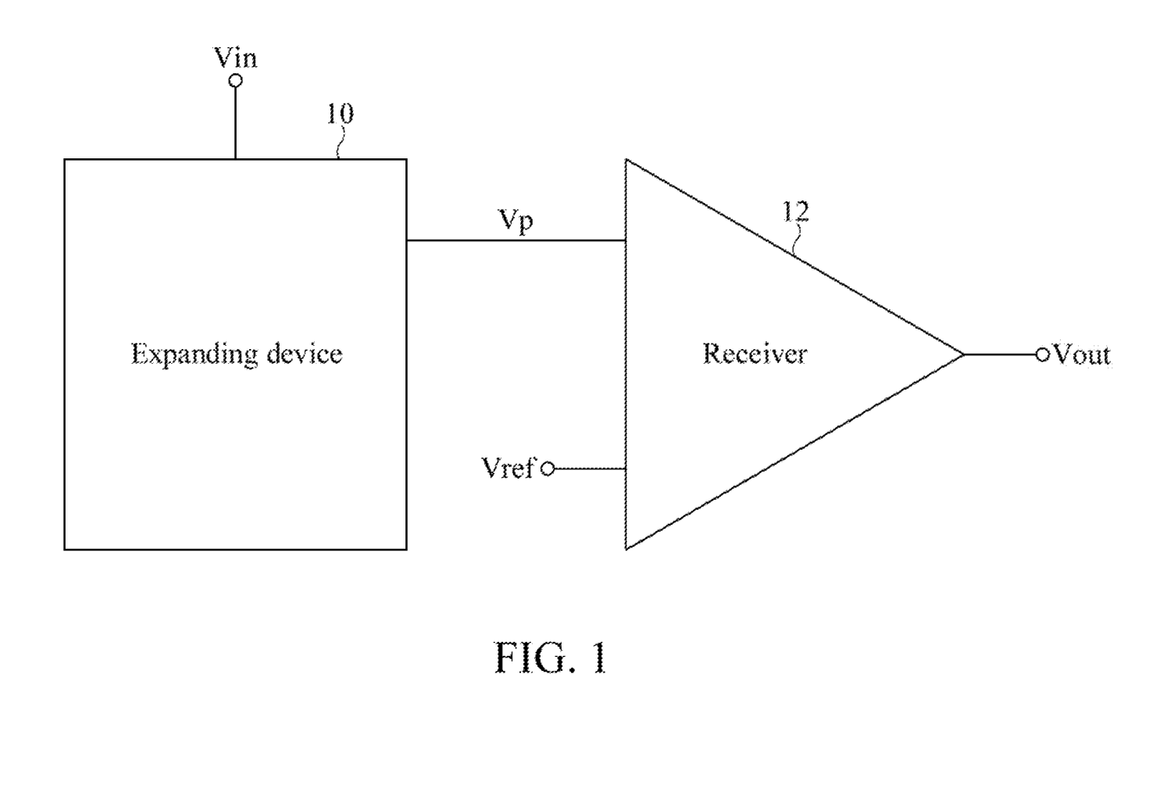
FIG. 1 is a schematic diagram of a semiconductor device, in accordance with some embodiments of the present disclosure.

FIG. 1 is a schematic diagram of a semiconductor device 1, in accordance with some embodiments of the present disclosure. Referring to FIG. 1, the semiconductor device 1 comprises a difference-expanding device 10 and a receiver 12. In some embodiments, the semiconductor device 1 serves as a device of a dynamic random access memory (DRAM).

In some embodiments, the difference-expanding device 10 functions to receive an input signal Vin. The input signal Vin includes, for example, a clock signal, a data signal, an address signal, and other suitable signals. The input signal Vin has voltage levels representing logical states. In some embodiments, the difference-expanding device 10 functions to convert the input signal Vin to a processed signal Vp by changing, based on the voltage levels, degrees in conduction of the difference-expanding device 10. In some embodiments, information in the processed signal Vp is maintained in the same manner as that in the input signal Vin, except that voltage levels representing logical states are changed. In some embodiments, by changing the degree of the conduction of the difference-expanding device 10, a difference between a voltage level representing a logically high state and a voltage level representing a logically low state is expanded, which facilitates increased accuracy in determining information.

In some embodiments, the receiver 12 functions to receive the processed signal Vp from the difference-expanding device 10, and compare the processed signal Vp to a reference voltage Vref, thereby outputting an output voltage Vout. In some embodiments, based on the comparison, the receiver 12 determines a logical state of the processed signal Vp, and provides the determination result in the output voltage Vout. In some embodiments, the receiver 12 includes a differential pair and a current mirror. The differential pair functions to receive the reference voltage Vref and the processed signal Vp.

In some existing DRAMs, a receiver directly receives an input signal, and compares the input signal to a reference voltage. However, the input signal may include noise, such that the receiver may not be able to correctly determine logical states of the input signal.

In the present disclosure, difference of voltage levels, which represents logical states, of the processed signal Vp is relatively large compared to that of the input signal Vin. In some embodiments, even if there is noise in the processed signal Vp, the adverse effect incurred by the noise compared to the relatively large difference in voltage levels representing logical states can be ignored; consequently, accuracy of the receiver 12 in determining logical states is relatively high.

Figure 2:
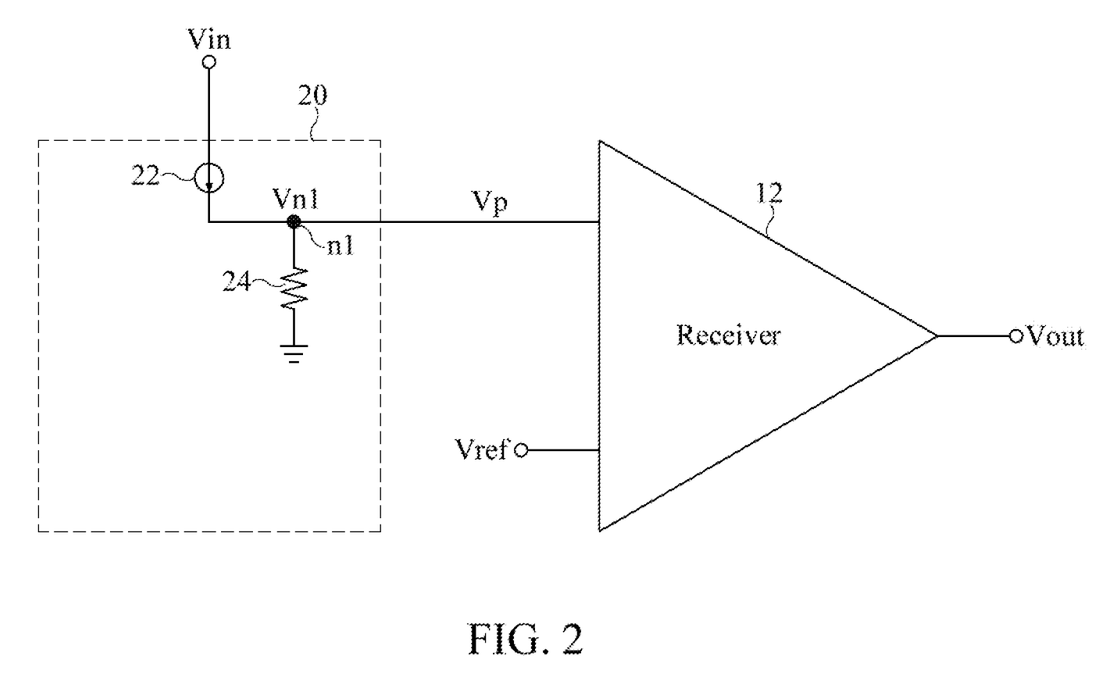
FIG. 2 is a schematic diagram of another semiconductor device, in accordance with some embodiments of the present disclosure.

FIG. 2 is a schematic diagram of another semiconductor device 2, in accordance with some embodiments of the present disclosure. Referring to FIG. 2, the semiconductor device 2 is similar to the semiconductor device 1 described and illustrated with reference to FIG. 1 except that, for example, the semiconductor device 2 comprises a difference-expanding device 20 including a current source 22 and a resistor 24.

In some embodiments, the current source 22, coupled between the input signal Vin and the resistor 24, functions to provide different currents to the resistor 24 in response to different voltage levels of the input signal Vin. In some embodiments, the current source 22 provides a first current to the resistor 24 in response to a first voltage level, which represents a logically high state of logical states of the input signal Vin, of the input signal Vin. In some embodiments, the current source 22 provides a second current to the resistor 24 in response to a second voltage level, which represents a logically low state of the logical states, of the input signal Vin. In some embodiments, the second current is significantly less than the first current.

In some embodiments, the resistor 24 functions to receive current from the current source 22, and to provide the processed voltage Vp based on the current. In some embodiments, a voltage Vn1 at a tap n1 between the current source 22 and the resistor 24 serves as the processed signal Vp. In some embodiments, a voltage at one terminal of the resistor 24 serves as the processed signal Vp, and a voltage level at the other terminal of the resistor 24 is a reference ground.

In some embodiments, as previously mentioned, the second current is significantly less than the first current; therefore, a voltage across the resistor 24 based on the second current is negligible compared to that based on the first current. In some embodiments, when the second current is received, a voltage level, which represents the logically low state, of the processed signal Vp, substantially equals the reference ground. In some embodiments, when the second voltage level of the input signal Vin is about 400 mV (millivolts), a voltage level, which represents a logically low state, at the tap n1 is about 0 V. In some embodiments, similarly, when the second voltage level of the input signal Vin is about 500 mV, a voltage level, which represents a logically low state, at the tap n1 is still about 0 V.

In the present disclosure, the current source 22 provides the extremely small second current in response to the logically low state of the input signal Vin. Accordingly, when the input signal Vin is converted to the processed signal Vp, a voltage level, which represents the logically low state, of the processed signal Vp, is substantially equal to the reference ground. In some embodiments, in summary, the difference between a voltage level representing the logically high state and a voltage level representing the logically low state is expanded. In some embodiments, even if there is noise in the processed signal Vp, the adverse effect incurred by the noise compared to the relatively large difference in the voltage levels can be ignored, consequently, accuracy of the receiver 12 in determining logical states is relatively high.

Figure 3:
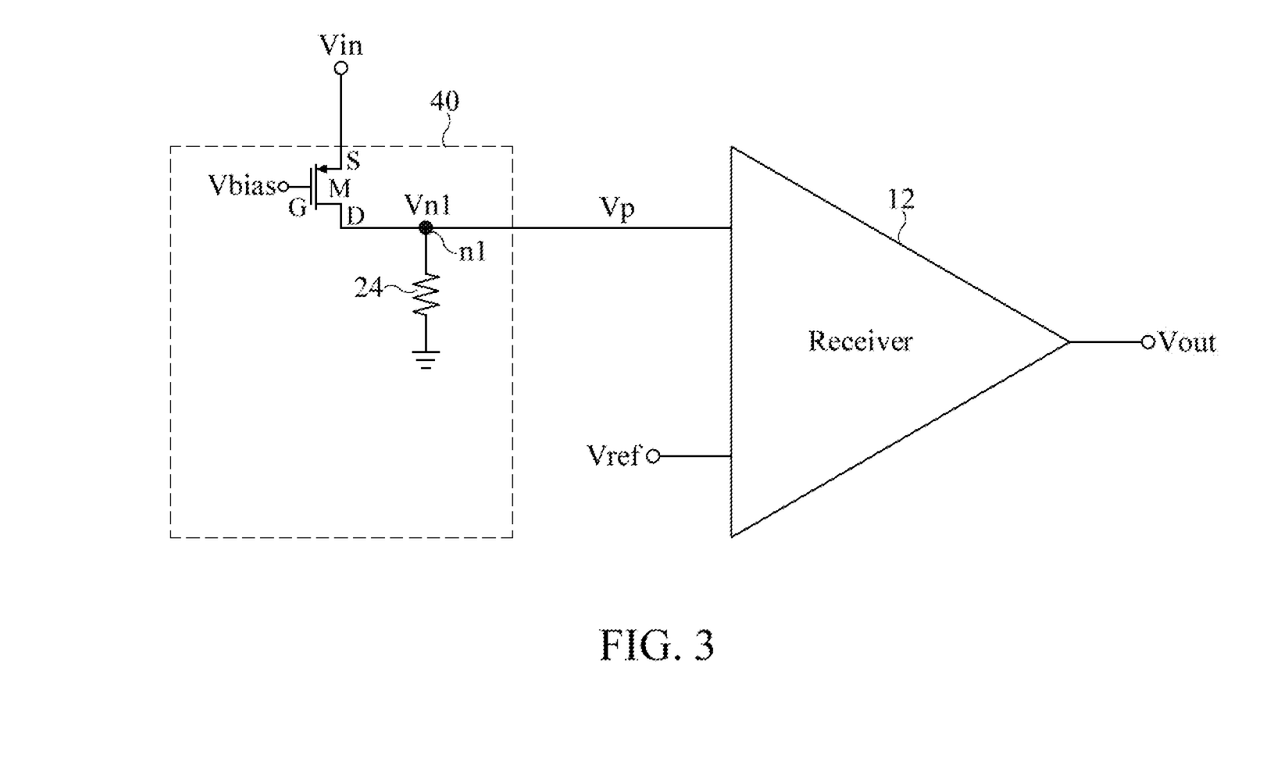
FIG. 3 is a schematic diagram of still another semiconductor device, in accordance with some embodiments of the present disclosure.

FIG. 3 is a schematic diagram of still another semiconductor device 4, in accordance with some embodiments of the present disclosure. Referring to FIG. 3, the semiconductor device 4 is similar to the semiconductor device 2 described and illustrated with reference to FIG. 2 except that, for example, the semiconductor device 4 comprises a difference-expanding device 40 including a p-type transistor M. In some embodiments, the p-type transistor M has a source S receiving the input signal Vin, a gate G receiving a bias voltage Vbias, and a drain D coupled to the tap n1 and an input of the receiver 12.

In some embodiments, the p-type transistor M is a power field-effect transistor, such as a p-type metal-oxide-semiconductor (PMOS) field-effect transistor.

In some embodiments, the bias voltage Vbias is designed, depending on the input signal Vin, such that a difference between the first voltage level of the input signal Vin and the bias voltage Vbias is greater than a threshold voltage of the p-type transistor M.

In some embodiments, by way of a current-versus-voltage characteristic of a transistor, the p-type transistor M can provide different currents in response to different voltage levels of the input signal Vin, such that the difference of the voltage levels is expanded as previously mentioned. In some embodiments, even if there is noise in the processed signal Vp, the adverse effect incurred by the noise compared to the relatively large difference in the voltage levels can be ignored; consequently, accuracy of the receiver 12 in determining logical states is relatively high.

Figure 4:
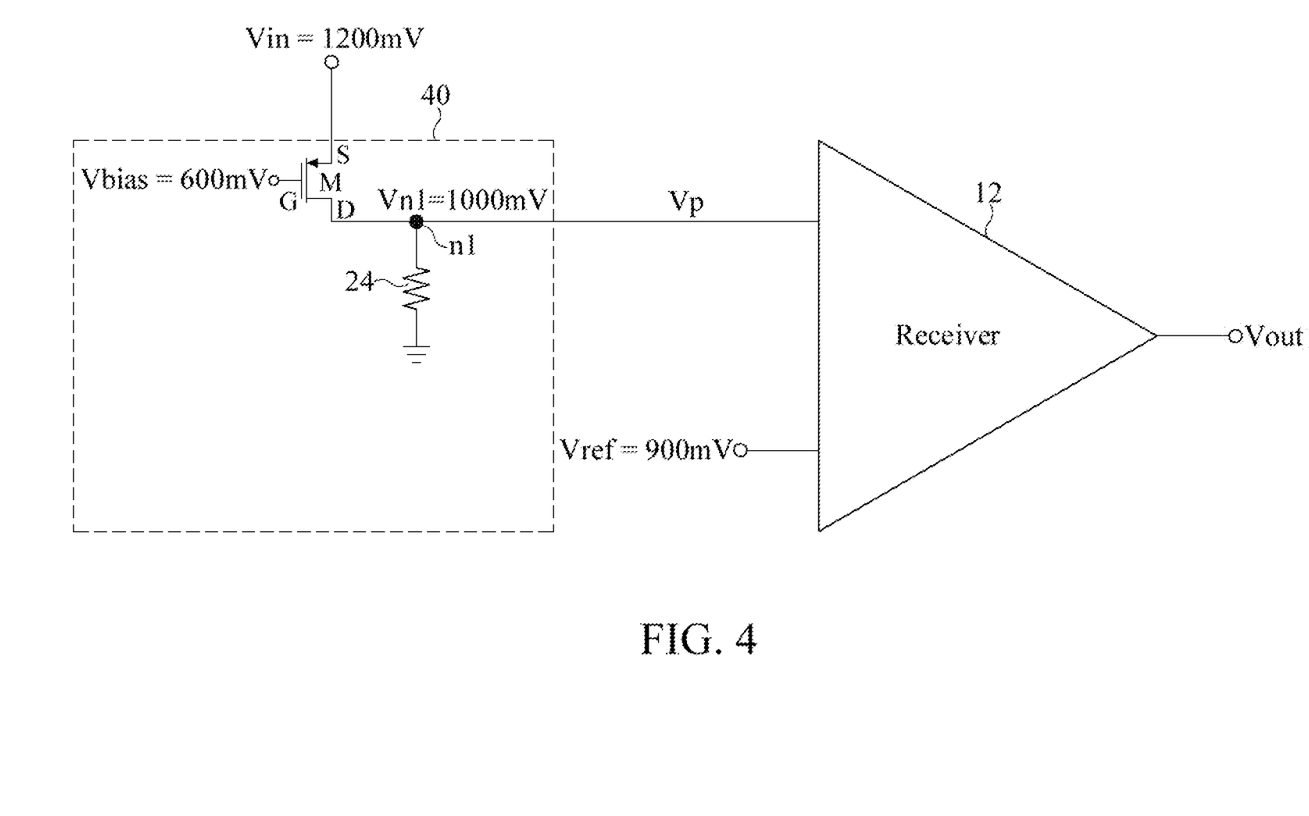
FIG. 4 is a schematic diagram illustrating an operation of the semiconductor device shown in FIG. 3, in accordance with some embodiments of the present disclosure.
Figure 5:
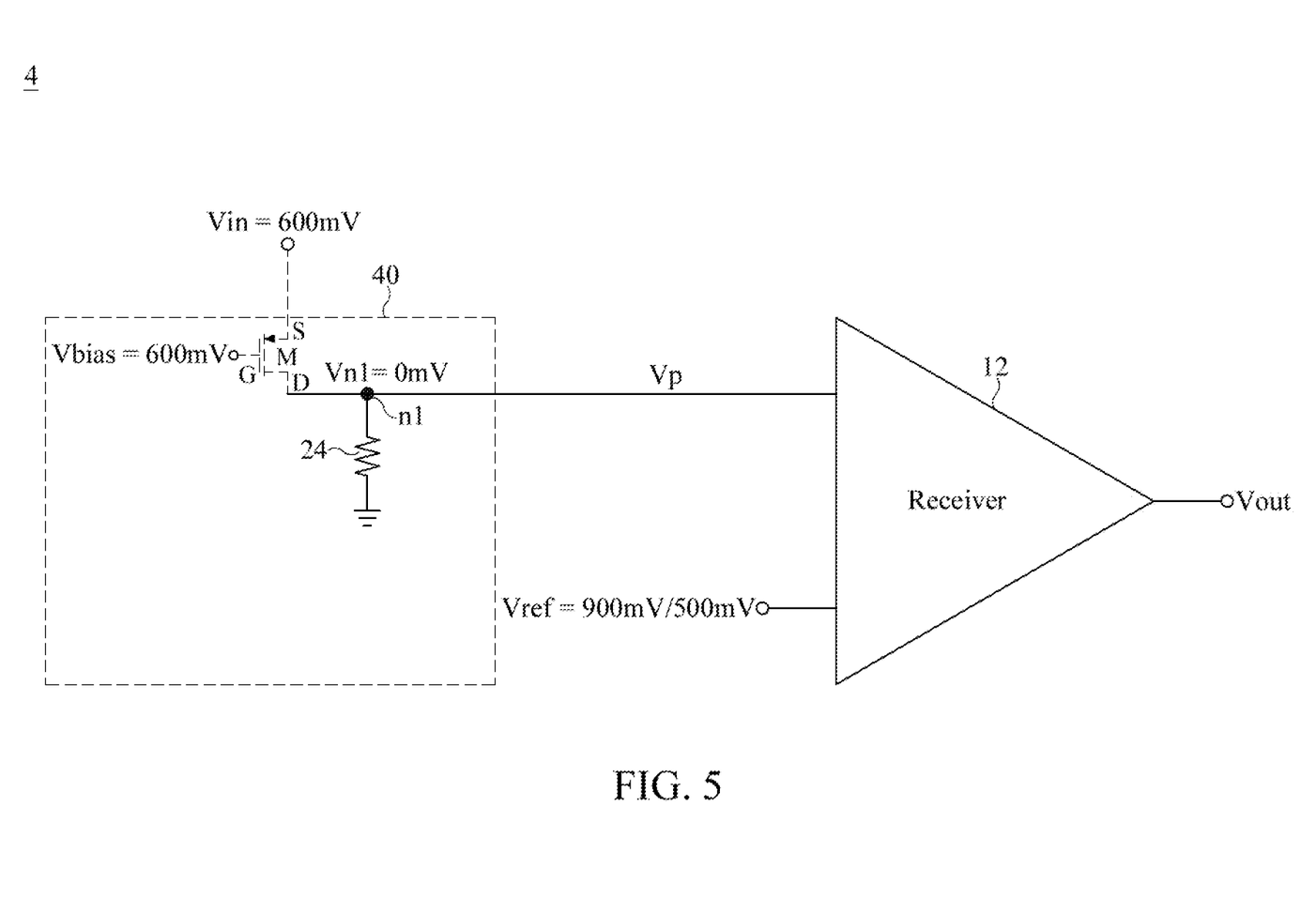
FIG. 5 is a schematic diagram illustrating another operation of the semiconductor device shown in FIG. 3, in accordance with some embodiments of the present disclosure.
Figure 6:
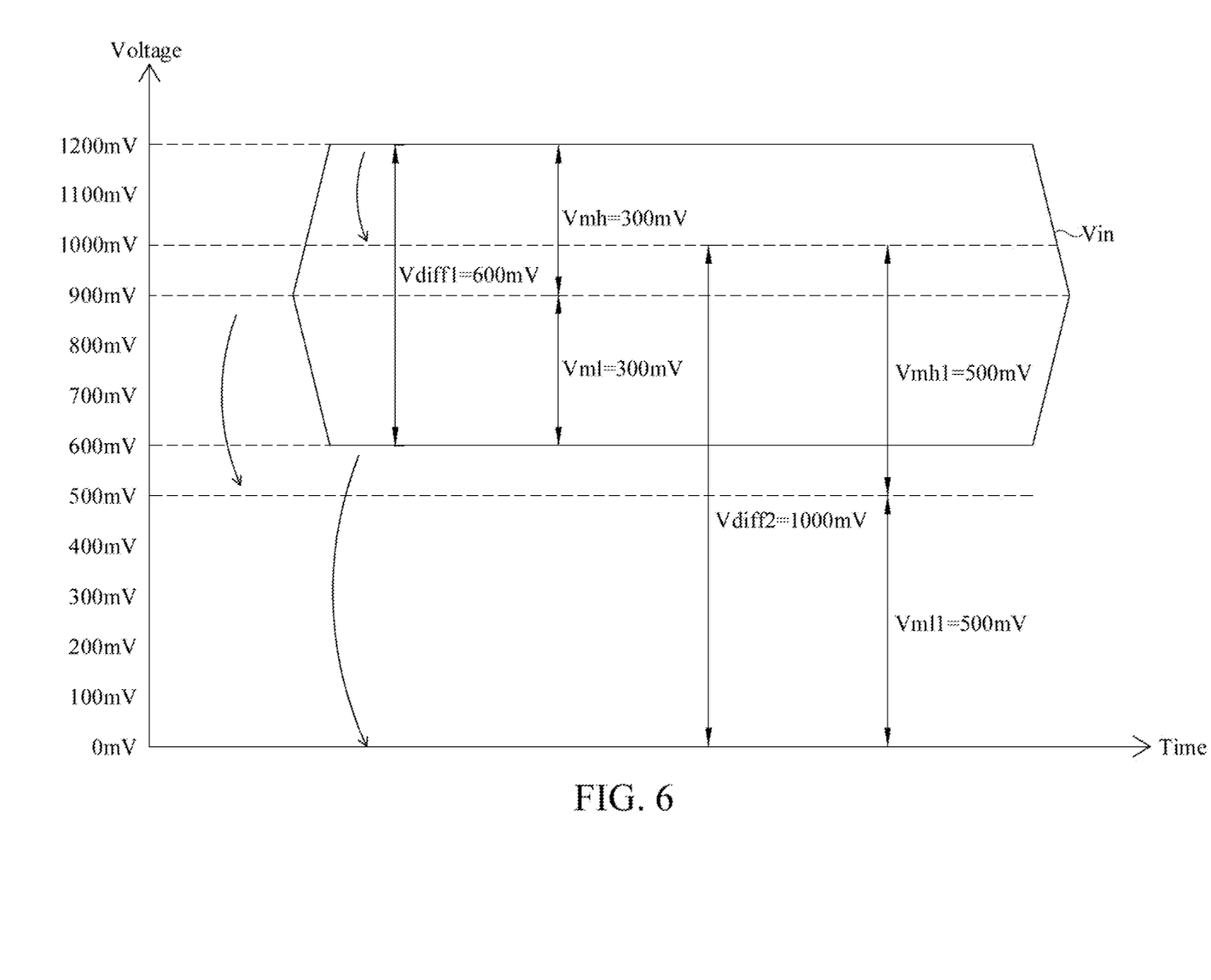
FIG. 6 is a waveform diagram illustrating the operations shown in FIGS. 4 and 5, in accordance with some embodiments of the present disclosure.

FIG. 4 is a schematic diagram illustrating an operation of the semiconductor device 4 shown in FIG. 3, in accordance with some embodiments of the present disclosure. FIG. 5 is a schematic diagram illustrating another operation of the semiconductor device 4 shown in FIG. 3, in accordance with some embodiments of the present disclosure. FIG. 6 is a waveform diagram illustrating the operations shown in FIGS. 4 and 5, in accordance with some embodiments of the present disclosure.

In the present embodiment, the semiconductor device 4 serves as a device of a DDR4 (double data rate 4). As a result, there is a self-training mechanism on the reference voltage Vref of the receiver 12. The reference voltage Vref is continually trained (or dynamically adjusted) to an optimal voltage between a voltage level, which represents a logically high state, and a voltage level, which represents a logically low state. In some embodiments, the optimal voltage includes a middle voltage between a voltage level, which represents a logically high state, and a voltage level, which represents a logically low state. However, the present disclosure is not limited thereto. For convenience of discussion, in the following discussion, the optimal voltage refers to the middle voltage.

Referring to FIGS. 4 to 6, for better understanding the operation of the semiconductor device 4 shown in FIG. 3, some values are provided. However, such values serve only as an example, and the present disclosure is not limited thereto. Assume that the first voltage level of the input signal Vin is about 1200 mV, the second voltage level is about 600 mV, the bias voltage Vbias is about 600 mV, and the threshold voltage of the p-type transistor M is about 200 mV. Moreover, generally, the reference voltage Vref is set at a middle voltage between the first voltage level and the second voltage level, i.e., about 900 mV.

In operation, referring to FIGS. 4 and 6, a source-to-gate voltage Vsg of the p-type transistor M is about 600 mV, which is greater than the threshold voltage of the p-type transistor M. Therefore, the p-type transistor M conducts well, exhibits a relatively small resistance, and provides a relatively large current to the resistor 24. Because of the relatively small resistance, the p-type transistor M and the resistor 24 slightly decrease the first voltage level of about 1200 mV of the input signal Vin by a first degree of about 200 mV, and provide about 1000 mV of the voltage Vn1 at the tap n1. The voltage Vn1 of 1000 mV serves as the processed signal Vp, and represents a logically high state.

Additionally, in operation, referring to FIGS. 5 and 6, the source-to-gate voltage Vsg of the p-type transistor M is about 0 mV, which is less than the threshold voltage of the p-type transistor M. Accordingly, the p-type transistor M is in, for example, a cut-off region. Therefore, the p-type transistor M does not conduct, exhibits a relatively large resistance, and provides no current, or an extremely small current, to the resistor 24. Because no current is provided, the p-type transistor M and the resistor 24 significantly decrease the second voltage level of about 600 mV of the input signal Vin by a second degree of about 600 mV, and provide about 0 mV of the voltage Vn1 at the tap n1. The voltage Vn1 of 0 mV serves as the processed signal Vp, and represents a logically low state. That is, the p-type transistor M and the resistor 24 increase the distinctness of the second voltage level by decreasing the second voltage level when the p-type transistor M conducts relatively poorly.

In summary, the p-type transistor M operates in a first conduction state in response to a logically low state. In addition, the p-type transistor M operates in a second conduction state in response to a logically high state. The first conduction state is less conductive than the second conduction state. The p-type transistor M and the resistor 24 increase the distinctness of a voltage that represents a logically low state.

Regarding the input signal Vin, a voltage difference Vdiff1 between the first voltage level and the second voltage level is about 600 mV. A voltage difference Vmh between the reference voltage Vref and the first voltage level is about 300 mV. A voltage difference Vml between the reference voltage Vref and the second voltage level is about 300 mV.

Regarding the processed signal Vp, a voltage difference Vdiff2 between a voltage level, which represents a logically high state, and a voltage level, which represents logically low state, is about 1000 mV. Moreover, in such case, due to the function of the self-training mechanism, the reference voltage Vref is adjusted from about 900 mV to about 500 mV. Accordingly, a voltage difference Vmh1 between the reference voltage Vref and a voltage level, which represents a logically high state, of the processed signal Vp is 500 mV. In addition, a voltage difference Vml1 between the reference voltage Vref and a voltage level, which presents a logically low state, of the processed signal Vp is 500 mV.

Compared to the voltage difference Vdiff1, the voltage difference Vml and the voltage difference Vmh, respectively, the voltage difference Vdiff2, the voltage difference Vml1 and the voltage difference Vmh1 are relatively large. As a result, even if there is noise in the processed signal Vp, the adverse effect incurred by the noise compared to the relatively large difference in the voltage levels can be ignored; consequently, accuracy of the receiver 12 in determining logical states is relatively high.

Figure 7:
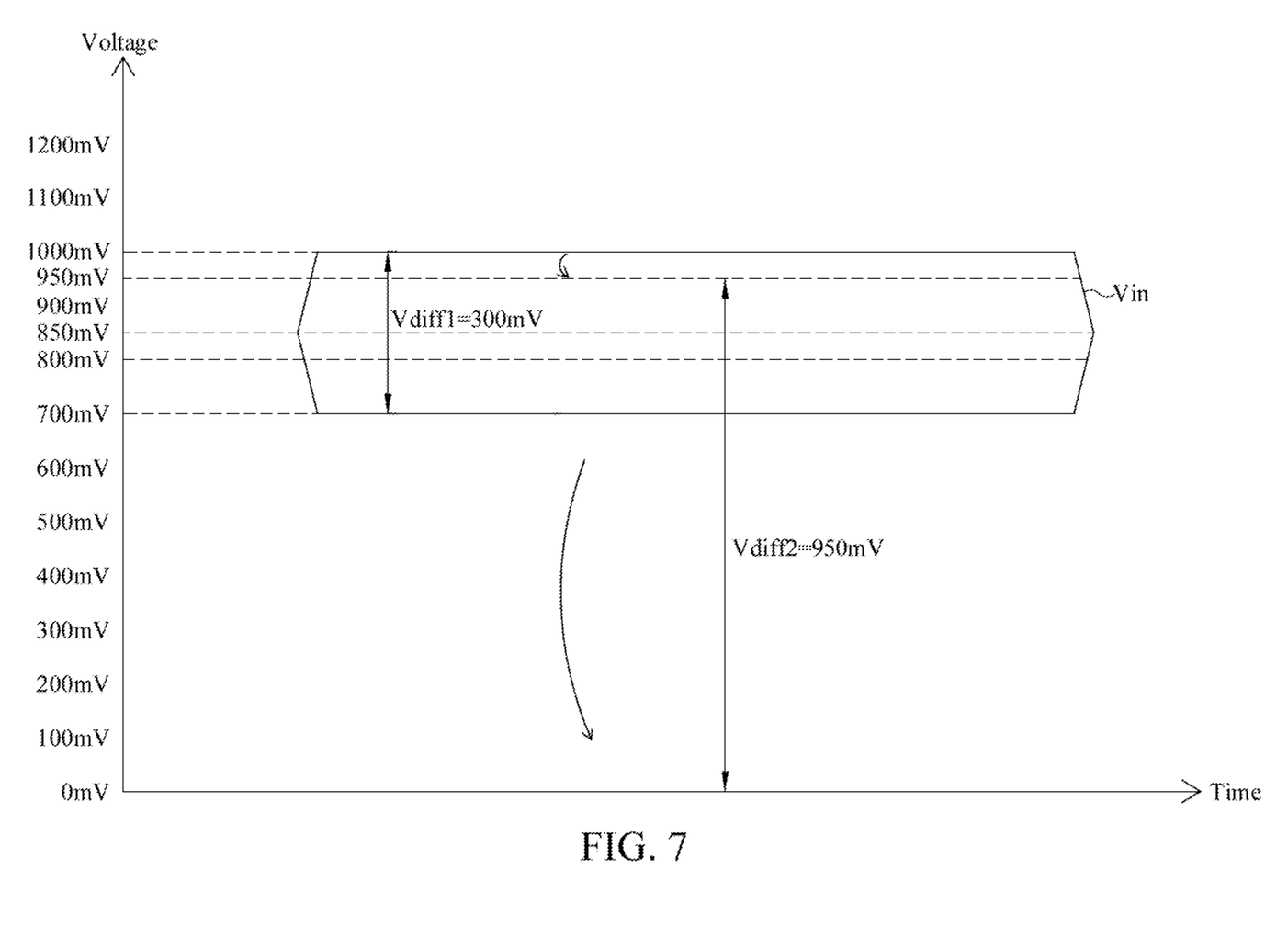
FIG. 7 is a waveform diagram illustrating a sub-optimal operation of the semiconductor device shown in FIG. 3, in accordance with some embodiments of the present disclosure.

FIG. 7 is a waveform diagram illustrating a suboptimal operation of the semiconductor device 4 shown in FIG. 3, in accordance with some embodiments of the present disclosure. Referring to FIG. 7 a first voltage level of the input signal Vin is about 1000 mV, and a second voltage level of the input signal Vin is about 700 mV. A voltage difference Vdiff1 therebetween is only about 300 mV, which is relatively small and may lead to higher likelihood of incorrectly determining logical states by the receiver 12.

In the present disclosure, with the difference-expanding device 4, the second voltage level of the input signal Vin is reduced significantly from about 700 mV to about 0 mV. On the other hand, the first voltage level of the input signal Vin is slightly reduced from about 1000 mV to about 950 mV. A voltage difference Vdiff2 is about 950 mV. A voltage difference increases from the voltage difference Vdiff1 of about 300 mV to the voltage difference Vdiff2 of about 950 mV, which is a relatively large increase.

In summary, even if the input signal Vin is suboptimal, with the difference-expanding device 4, the difference of the voltage levels is expanded as described above; consequently, accuracy of the receiver 12 in determining logical states in the worst case is relatively high.

Figure 8:
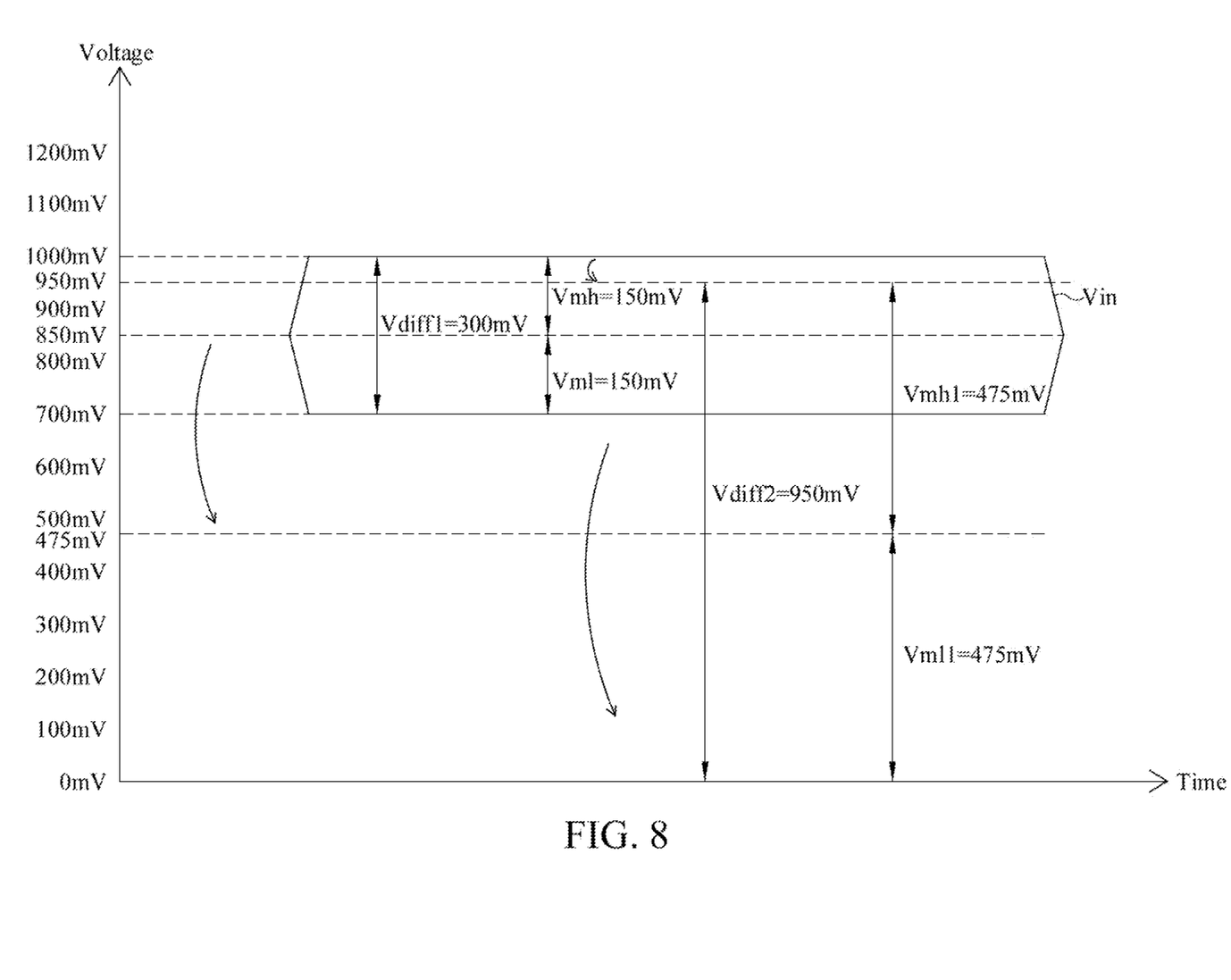
FIG. 8 is a waveform diagram illustrating another operation associated with the embodiment of FIG. 7, in accordance with some embodiments of the present disclosure.

FIG. 8 is a waveform diagram illustrating another operation associated with the embodiment of FIG. 7, in accordance with some embodiments of the present disclosure. Referring to FIG. 8, similar to the embodiment of FIG. 6, the semiconductor device 4 serves as a device of a DDR4. As a result, the voltage difference Vml1 becomes about 475 mV, which is greater than the voltage difference Vml of about 150 mV. Moreover, a voltage difference Vmh1 is about 475 mV, which is greater than the voltage difference Vmh of about 150 mV. As a result, even if there is noise in the processed signal Vp, the adverse effect incurred by the noise compared to the relatively large difference in the voltage levels can be ignored; consequently, accuracy of the receiver 12 in determining logical states is relatively high.

Figure 9:
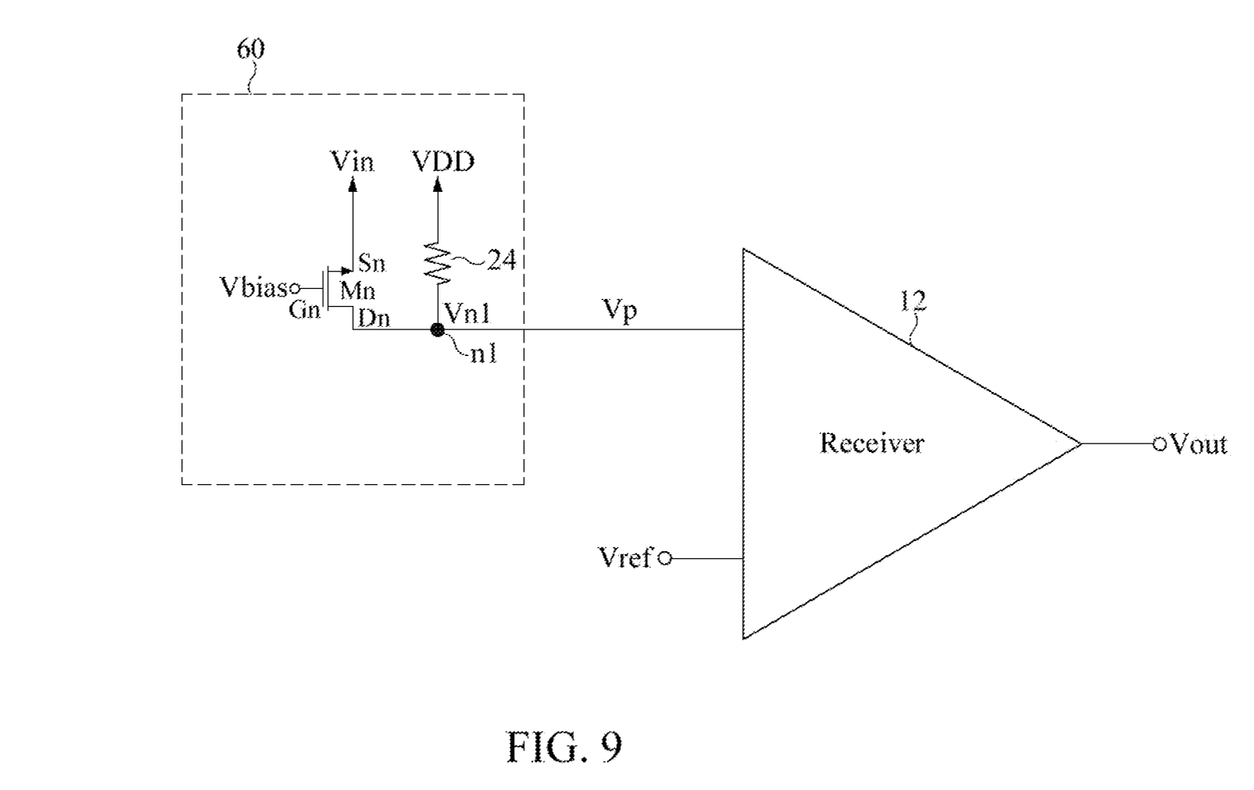
FIG. 9 is a schematic diagram of further another semiconductor device, in accordance with some embodiments of the present disclosure.

FIG. 9 is a schematic diagram of further another semiconductor device 6, in accordance with some embodiments of the present disclosure. Referring to FIG. 9, the semiconductor device 6 is similar to the semiconductor device 4 described and illustrated with reference to FIG. 3 except that, for example, the semiconductor device 6 includes a difference-expanding device 60.

The difference-expanding device 60 includes an n-type transistor Mn and a resistor 24. The n-type transistor Mn includes a source Sn receiving an input signal Vin, a gate Gn receiving a bias voltage Vbias and a drain Dn coupled to an input of the receiver 12. The resistor 24 is coupled between a supply voltage VDD and the input of the receiver 12.

Operation of the difference-expanding device 60 is similar to that of the difference-expanding device 40. Descriptions of similar details are therefore omitted herein. Briefly, in response to the second voltage level of the input signal Vin, the n-type transistor Mn conducts relatively well, and provides a relatively large current to the resistor 24. The n-type transistor Mn and the resistor 24 slightly increase the second voltage level of the input signal Vin. That is, a voltage level, which represents a logically low state, of the processed signal Vp is slightly higher than the second voltage level of the input signal Vin.

In contrast, in response to the first voltage level of the input signal Vin, the n-type transistor Mn conducts relatively poorly, and the n-type transistor Mn provides a relatively small current to the resistor 24. Because of the relatively small current, a voltage across the resistor 24 is substantially negligible. The n-type transistor Mn and resistor 24 significantly increase the first voltage level of the input signal Vin. The increased first voltage level substantially equals the supply voltage VDD. That is, the voltage level, which represents a logically high state, of the processed signal Vp is significantly higher than the first voltage level of the input signal Vin. As a result, the n-type transistor Mn and the resistor 24 increase the distinctness of the first voltage level by increasing the first voltage level when the n-type transistor Mn conducts relatively poorly. As a result, the difference between the voltage levels is expanded, as described above. In some embodiments, even if there is noise in the processed signal Vp, the adverse effect incurred by the noise compared to the relatively large difference in the voltage levels can be ignored; consequently, accuracy of the receiver 12 in determining logical states is relatively high.

Figure 10:
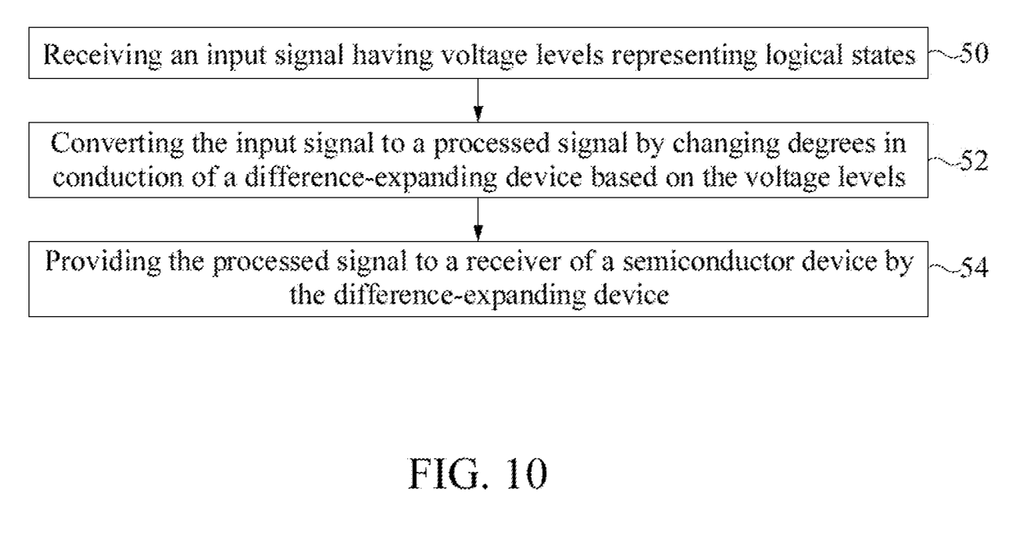
FIG. 10 is a flowchart illustrating a method of operating a semiconductor device, in accordance with some embodiments of the present disclosure.

FIG. 10 is a flowchart illustrating a method 5 of operating a semiconductor device, in accordance with some embodiments of the present disclosure. In some embodiments, referring to FIG. 5, the method 5 includes operations 50, 52 and 54.

In some embodiments, the method 5 begins with operation 50, in which an input signal having voltage levels representing logical states is received.

In some embodiments, the method 5 proceeds to operation 52, in which the input signal is converted to a processed signal by changing degrees in conduction of a difference-expanding device based on the voltage levels.

In some embodiments, the method 5 continues with operation 52, in which the processed signal is provided to a receiver of the semiconductor device by the difference-expanding device.

The method 5 is merely an example, and is not intended to limit the present disclosure beyond what is explicitly recited in the claims. Additional operations can be provided before, during, and after the method 5, and some operations described can be replaced, eliminated, or moved around for additional embodiments of the method.

In the present disclosure, by changing the degrees in the conduction of the difference-expanding device 10, a difference between a voltage level representing a logically high state and a voltage level representing a logically low state is expanded, which facilitates increased accuracy in determining information.

In some existing DRAMs, a receiver directly receives an input signal, and compares the input signal to a reference voltage. However, there may be noise in the input signal, such that the receiver may not be able to correctly determine logical states of the input signal.

In the present disclosure, the difference of the voltage levels of the processed signal Vp is relatively large compared to the difference of the voltage levels of the input signal Vin. Even if there is noise in the processed signal Vp, the adverse effect incurred by the noise compared to the relatively large difference in the voltage levels can be ignored; consequently, accuracy of the receiver 12 in determining logical states is relatively high.

One embodiment of the present disclosure provides a semiconductor device. The semiconductor device includes a difference-expanding device and a receiver. The difference-expanding device is configured to receive an input signal having voltage levels representing logical states, and to convert the input signal to a processed signal by changing, based on the voltage levels, degrees in conduction of the difference-expanding device. The receiver is configured to receive the processed signal from the difference-expanding device, and determine the logical states of the input signal based on the processed signal.

Another embodiment of the present disclosure provides a semiconductor device. The semiconductor device includes a difference-expanding device and a receiver. The difference-expanding device is configured to convert an input signal to a processed signal. The difference-expanding device includes a resistor and a current source. The current source is configured to provide a first current to the resistor in response to a first voltage level, which represents a logically high state of logical states of the input signal, of the input signal. The current source is configured to provide a second current to the resistor in response to a second voltage level, which represents a logically low state of the logical states, of the input signal. The voltage at a tap between the current source and the resistor serves as the processed signal. A voltage across the resistor based on the second current is negligible compared to that based on the first current. The receiver is configured to receive the processed signal from the difference-expanding device, and determine the logical states of the input signal based on the processed signal.

Another embodiment of the present disclosure provides a semiconductor device. The semiconductor device includes a difference-expanding device and a receiver. The difference-expanding device is configured to receive an input signal, and convert the input signal to a processed signal by expanding a difference between a first voltage level of the input signal and a second voltage level of the input signal. The first voltage level represents a logically high state of logical states of the input signal. The second voltage level represents a logically low state of the logical states of the input signal. The receiver is configured to receive the processed signal from the difference-expanding device, and determine the logical states of the input signal based on the processed signal.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a difference-expanding device configured to receive a bias and an input signal having a first voltage level representing a first logical state and a second voltage level representing a second logical state, and convert the input signal to a processed signal by changing, based on a voltage difference between the bias and the input signal, degrees in conduction of the difference-expanding device; and
   a receiver configured to receive the processed signal from the difference-expanding device, and determine the input signal represents a logically low state or a logically high state based on the processed signal.

2. The semiconductor device of claim 1, wherein the difference-expanding device is configured to operate in a first conduction state in response to a first voltage level of the voltage levels, and configured to operate in a second conduction state in response to a second voltage level of the voltage levels,
   wherein the first conduction state is less conductive than the second conduction state, and
   wherein the difference-expanding device is further configured to increase a distinctness of the first voltage level, wherein the first voltage level represents the first logical state.

3. The semiconductor device of claim 2, wherein when the first logical state is a logically low state, the difference-expanding device increases the distinctness of the first voltage level by decreasing the first voltage level, wherein the decreased first voltage level serves as a voltage level, which represents the logically low state, of the processed voltage.

4. The semiconductor device of claim 3, wherein the difference-expanding device includes:
   a resistor coupled between the receiver and a reference ground; and
   a p-type transistor including a source receiving the input signal, and a drain coupled to both the resistor and the receiver.

5. The semiconductor device of claim 2, wherein when the first logical state is a logically high state, the difference-expanding device increases the distinctness of the first voltage level by increasing the first voltage level, wherein the increased first voltage level serves as a voltage level, which represents the logically high state, of the processed voltage.

6. The semiconductor device of claim 5, wherein the difference-expanding device includes:
   a resistor coupled between the receiver and a supply voltage; and
   an n-type transistor including a source receiving the input signal, and a drain coupled to both the resistor and the receiver.

7. The semiconductor device of claim 6, wherein the drain of the n-type transistor is directly coupled to the resistor and the receiver.

8. A semiconductor device, comprising:
   a difference-expanding device configured to convert an input signal to a processed signal, the difference-expanding device including:
   a resistor; and
   a current source coupled between the input signal and the resistor, and a voltage level at the other terminal of the resistor is a reference ground, the current source configured to:
   provide a first current to the resistor in response to a first voltage level, which represents a logically high state of logical states, of the input signal; and
   provide a second current to the resistor in response to a second voltage level, which represents a logically low state, of the input signal,
   wherein a voltage at a tap between the current source and the resistor serves as the processed signal, and
   wherein a voltage across the resistor based on the second current is negligible compared to a voltage across the resistor based on the first current; and
   a receiver configured to receive the processed signal from the difference-expanding device, and determine the logical states of the input signal based on the processed signal.

9. The semiconductor device of claim 8, wherein the resistor and the current source are coupled between the input signal and a reference ground.

10. The semiconductor device of claim 9, wherein a voltage at one terminal of the resistor serves as the processed signal, and a voltage level at the other terminal of the resistor is the reference ground.

11. A semiconductor device, comprising:
   a difference-expanding device configured to receive an input signal and a bias, and convert the input signal to a processed signal, based on the input signal and the bias, by expanding a difference between a first voltage level of the input signal and a second voltage level of the input signal,
   wherein the first voltage level represents a logically high state of logical states of the input signal, and the second voltage level represents a logically low state of the logical states of the input signal; and
   a receiver configured to receive the processed signal from the difference-expanding device, and determine the logical states of the input signal based on the processed signal.

12. The semiconductor device of claim 11, wherein the difference-expanding device is configured to expand the difference by:
   decreasing the first voltage level by a first degree; and
   decreasing the second voltage level by a second degree greater than the first degree.

13. The semiconductor device of claim 11, wherein the difference-expanding device is configured to expand the difference by:
   increasing the first voltage level by a first degree; and
   increasing the second voltage level by a second degree less than the first degree.

14. The semiconductor device of claim 11, wherein the receiver is further configured to compare the processed signal to a reference voltage, wherein the reference voltage is dynamically adjusted between the first voltage level and the second voltage level.

* * * * *